(12) United States Patent
Kim (10) Patent No.: US 8,313,977 B2
(45) Date of Patent: Nov. 20, 2012

(54) IMAGE SENSOR AND METHOD FOR MANUFACTURING THE SAME

(75) Inventor: Tae Gyu Kim, Masan-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 507 days.

(21) Appl. No.: 12/625,300

(22) Filed: Nov. 24, 2009

(65) Prior Publication Data

US 2010/0133641 A1 Jun. 3, 2010

(30) Foreign Application Priority Data

Dec. 3, 2008 (KR) .................... 10-2008-0121718

(51) Int. Cl.
*H01L 21/00* (2006.01)

(52) U.S. Cl. ............ 438/98; 438/73; 257/222; 257/225; 257/459; 257/461; 257/E27.133; 257/E27.135

(58) Field of Classification Search .................. 257/222, 257/225, 459, 461, E27.133, E27.135; 438/73, 438/98
See application file for complete search history.

(56) References Cited

U.S. PATENT DOCUMENTS

| | | | |
|---|---|---|---|
| 7,884,401 B2 * | 2/2011 | Shim | 257/292 |
| 2009/0065827 A1 * | 3/2009 | Hwang | 257/292 |
| 2009/0179295 A1 * | 7/2009 | Hwang | 257/461 |

* cited by examiner

*Primary Examiner* — Julio J Maldonado
*Assistant Examiner* — Yu-Hsi D Sun
(74) *Attorney, Agent, or Firm* — Saliwanchik, Lloyd & Eisenschenk (57) ABSTRACT

Provided are an image sensor and a method for manufacturing the same. The image sensor comprises a semiconductor substrate, an interconnection and an interlayer dielectric, a lower electrode layer, an image sensing device, a first via hole, a barrier pattern, a second via hole, and a metal contact. The semiconductor substrate comprises a readout circuitry. The interconnection and the interlayer dielectric are formed on the semiconductor substrate. The lower electrode layer is disposed over the interlayer dielectric. The image sensing device is disposed on the lower electrode layer. The first via hole is formed through the image sensing device. The barrier pattern is formed on a sidewall of the first via hole. The second via hole is formed through the lower electrode layer and the interlayer dielectric under the first via hole. The metal contact is formed in the first and second via holes.

8 Claims, 7 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0121718, filed Dec. 3, 2008, which is hereby incorporated by reference in its entirety.

BACKGROUND

The present disclosure relates to an image sensor.

Generally, image sensors are semiconductor devices that can convert optical images into electrical signals. Image sensors are roughly divided into charge coupled devices (CCDs) and complementary metal oxide semiconductor (CMOS) image sensors.

CMOS image sensors have a structure in which a photodiode region, converting optical signals into electrical signals, and a transistor region, processing the electrical signals, are horizontally disposed.

In the horizontal type image sensor, since the photodiode region and the transistor region are horizontally disposed in a semiconductor substrate, there is a limitation in expanding an optical sensing part (referred to as "fill factor") within a limited area.

BRIEF SUMMARY

Embodiments provide an image sensor and a method for manufacturing the same, which can provide vertical integration of a transistor circuit and a photodiode.

In one embodiment, an image sensor comprises: a semiconductor substrate comprising a readout circuitry; an interconnection and an interlayer dielectric on the semiconductor substrate, the interconnection being electrically connected to the readout circuitry; a lower electrode layer over the interlayer dielectric; an image sensing device on the lower electrode layer; a first via hole through the image sensing device, the first via hole exposing the lower electrode layer at a region corresponding to the interconnection; a barrier pattern on a sidewall of the first via hole; a second via hole through the lower electrode layer and the interlayer dielectric under the first via hole, the second via hole exposing the interconnection; and a metal contact in the first and second via holes, the metal contact electrically connecting the lower electrode layer and the interconnection.

In another embodiment, a method for manufacturing an image sensor comprises: forming a readout circuitry on a semiconductor substrate; forming an interconnection and an interlayer dielectric on the semiconductor substrate, the interconnection being electrically connected to the readout circuitry; forming an image sensing device on a carrier substrate; forming a lower electrode layer on the image sensing device; forming a junction layer on the lower electrode layer; bonding the image sensing device to the interlayer dielectric using the junction layer as a bonding layer; forming a first via hole through the image sensing device, the first via hole exposing the lower electrode layer in a region corresponding to the interconnection; forming a barrier pattern on a sidewall of the first via hole; forming a second via hole through the lower electrode layer and the interlayer dielectric under the first via hole, the second via hole exposing the interconnection; and forming a metal contact in the first via hole and the second via hole to electrically connect the lower electrode layer and the interconnection.

The details of one or more embodiments are set forth in the accompanying drawings and the description below. Other features will be apparent from the description and drawings, and from the claims.

DETAILED DESCRIPTION

Hereinafter, an image sensor and a method for manufacturing the same according to preferred embodiments will be described in detail with reference to the accompanying drawings.

Embodiments are not limited to a CMOS image sensor. For example, embodiments can be applied to all image sensors that use a photodiode, including a CCD image sensor.

Figure 1:
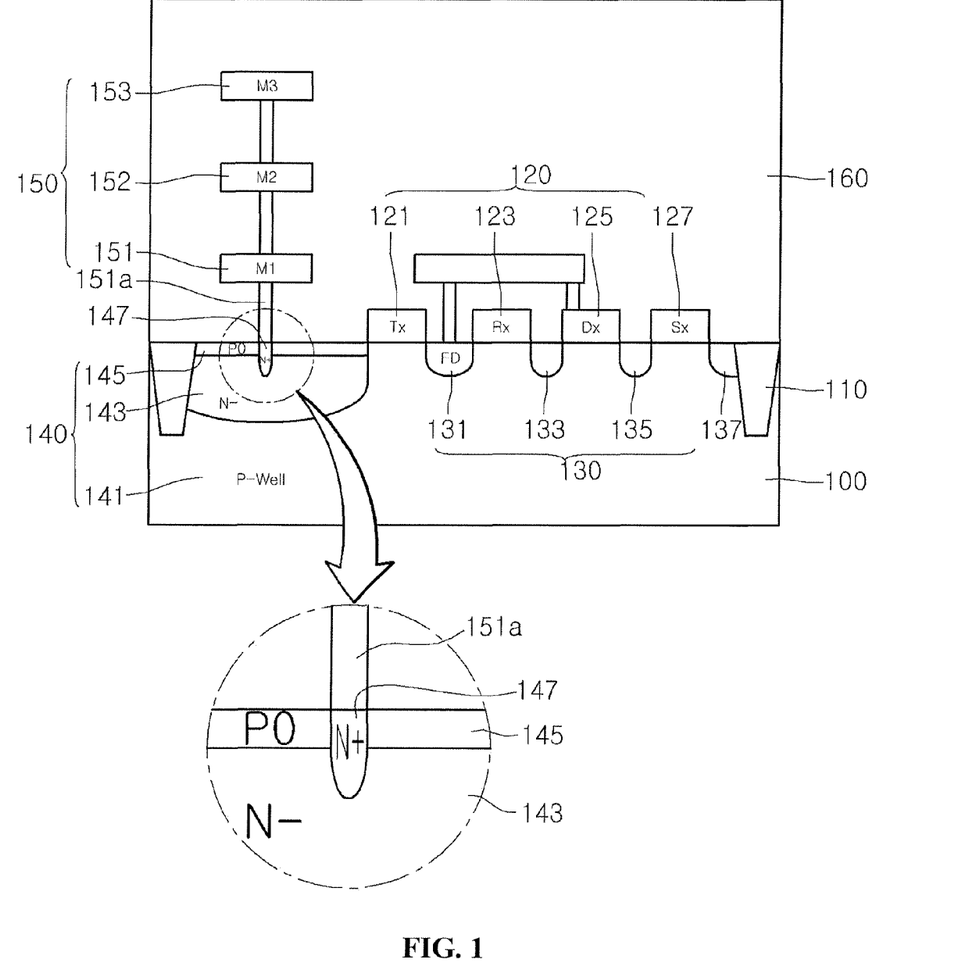
FIGS. 1 through 12 are cross-sectional views illustrating a process for manufacturing an image sensor according to an embodiment.
Figure 12:
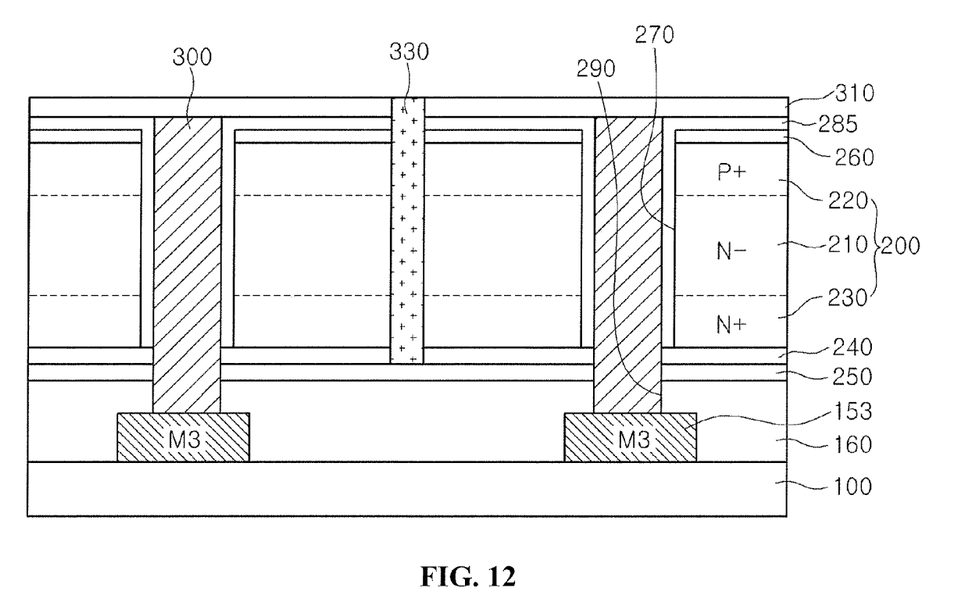

FIG. 12 is a cross-sectional view illustrating an image sensor according to an embodiment; and FIG. 1 shows an enlarged view of a substrate 100 in accordance with one embodiment of the present invention.

Referring to FIGS. 1 and 12, an image sensor according to one embodiment includes: a semiconductor substrate 100 including a readout circuitry (see reference 120 of FIG. 1); an interconnection 150 and an interlayer dielectric 160 on the semiconductor substrate 100, the interconnection 150 being electrically connected to the readout circuitry 120; a lower electrode layer 240 over the interlayer dielectric 160; an image sensing device 200 on the lower electrode layer 240; a first via hole 270 through the image sensing device 200, the first via hole 270 exposing the lower electrode layer 240 at a region corresponding to the interconnection 150; a barrier pattern 285 on a sidewall of the first via hole 270; a second via hole 290 through the lower electrode layer 240 and the interlayer dielectric 160 under the first via hole 270, the second via hole 290 exposing a top metal layer 153 of the interconnection 150; and a fourth metal contact 300 in the first and second via holes 270 and 290, the fourth metal contact 300 electrically connecting the lower electrode layer 240 and the interconnection 150.

A junction layer 250 is formed between the interlayer dielectric 160 and the lower electrode layer 240. For example, the junction layer 250 may be formed of the same material as the interlayer dielectric 160.

A pixel isolation layer 330 can be formed through the image sensing device 200 and the lower electrode layer 240 at a boundary of unit pixels between fourth metal contacts 300 that are formed in each unit pixel. Accordingly, the image sensing device 200 and the lower electrode layer 240 may be separated into unit pixels.

The image sensing device 200 can have an ohmic contact layer 230, a first doped layer, and a second doped layer 220 stacked therein. The lower electrode layer 240 is overall formed under the ohmic contact layer 230. For example, the lower electrode layer 240 may be formed of a conductive material including a metal.

According to an embodiment, the lower electrode layer 240 is overall formed under the image sensing device 200, and may be electrically connected to the interconnection 150 through the fourth metal contact 300. That is, the lower electrode layer 240 may serve as an ohmic contact layer of the image sensing device 200, thereby enhancing transmission efficiency of photocharges.

Unexplained reference numerals of FIG. 12 will be described with reference to the accompanying drawings illustrating a method for manufacturing the image sensor below.

Hereinafter, a method for manufacturing an image sensor according to an embodiment will be described with reference to FIGS. 1 through 12.

Referring to FIG. 1, an interconnection 150 and an interlayer dielectric 160 are formed on a semiconductor substrate 100 including a readout circuitry 120.

The semiconductor substrate 100 may be a mono- or poly-crystalline silicon substrate, and may be a substrate doped with P-type impurities or N-type impurities. For example, a device isolation layer 110 is formed in the semiconductor substrate 100 to define an active region. A readout circuit 120 including transistors for a unit pixel is formed in the active region.

The readout circuit 120 may include a transfer transistor (Tx) 121, a reset transistor (Rx) 123, a drive transistor (Dx) 125, and a select transistor (Sx) 127. An ion implantation region 130 including a floating diffusion region (FD) 131 and source/drain regions 133, 135 and 137 for each transistor may be formed. The readout circuit 120 may also be applied to a three transistor (3Tr) or five transistor (5Tr) structure.

The forming of the readout circuitry 120 in the semiconductor substrate 100 may include forming an electrical junction region 140 in the first substrate 100 and forming a poly contact 147 connected to the interconnection 150 on the electrical junction region 140.

The electrical junction region 140 may be a P-N junction 140, but is not limited thereto. For example, the electrical junction region 140 may include a first conductive type ion implantation layer 143 formed on a second conductive type well 141 or second conductive type epitaxial layer, and a second conductive type ion implantation layer 145 formed on the first conductive type ion implantation layer 143. For example, as shown in FIG. 1, the P-N junction 140 may be a P0(145)N-(143)/P-(141) junction, but is not limited thereto. The semiconductor substrate 100 may be a second conductive type, but is not limited thereto.

According to an embodiment, the device is designed to provide a potential difference between the source and drain of the transfer transistor (Tx), thereby enabling the full dumping of photocharges. Thus, as photocharges generated in a photodiode are dumped to a floating diffusion region, the sensitivity of an output image can be enhanced.

Figure 2:
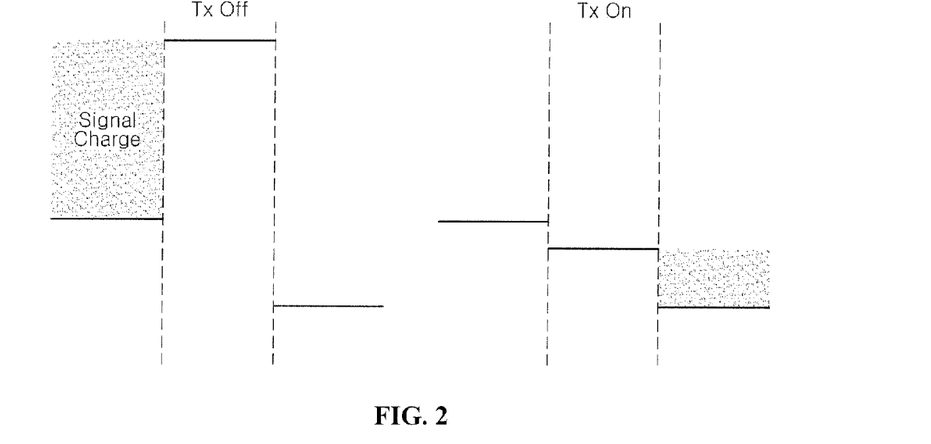

That is, the electrical junction region 140 is formed in the first substrate 100 including the readout circuit 120 to provide a potential difference between the source and drain of the transfer transistor (Tx) 121, thereby enabling the full dumping of the photocharges (see FIG. 2).

According to an embodiment, unlike a floating diffusion (FD) 131 node of an N+ junction, the P/N/P junction 140 of the electrical junction region 140 is pinched off at a predetermined voltage without an applied voltage being fully transferred thereto. This voltage is called a pinning voltage. The pinning voltage depends on the P0 (145) and N- (143) doping concentration.

Specifically, electrons generated in the photodiode are moved to the PNP junction 140, and delivered to the floating diffusion (FD) 131 node to be converted into a voltage when the transfer transistor (Tx) 121 is turned on.

Accordingly, unlike a case where a photodiode is simply connected to an N+ junction in a related-art image sensor, this embodiment can avoid saturation reduction and sensitivity degradation.

Thereafter, a first conductive type connection 147 is formed between the photodiode and the readout circuit 120 to create a smooth transfer path of photocharges, thereby making it possible to minimize a dark current source and inhibit saturation reduction and sensitivity degradation.

For this, an N+ doping region may be formed as a first conductive type connection 147 for an ohmic contact on the surface of the P0/N-/P- junction 140. The N+ region 147 may be formed to contact N- 143 through the P0 145.

The width of the first conductive type connection 147 may be minimized to inhibit the first conductive type connection 147 from becoming a leakage source.

For this, according to one embodiment, a plug implant may be performed after the etching of a contact hole for a first metal contact 151a, but is not limited thereto. For example, an ion implantation pattern (not shown) can be formed, and the first conductive type connection 147 may be formed using the ion implantation pattern as an ion implantation mask.

That is, a reason why an N+ doping is locally performed only on a contact formation region as described in this embodiment is to minimize a dark signal and facilitate formation of an ohmic contact. If the entire Tx source region is N+ doped like a related art, a dark signal may increase due to an Si surface dangling bond.

Figure 3:
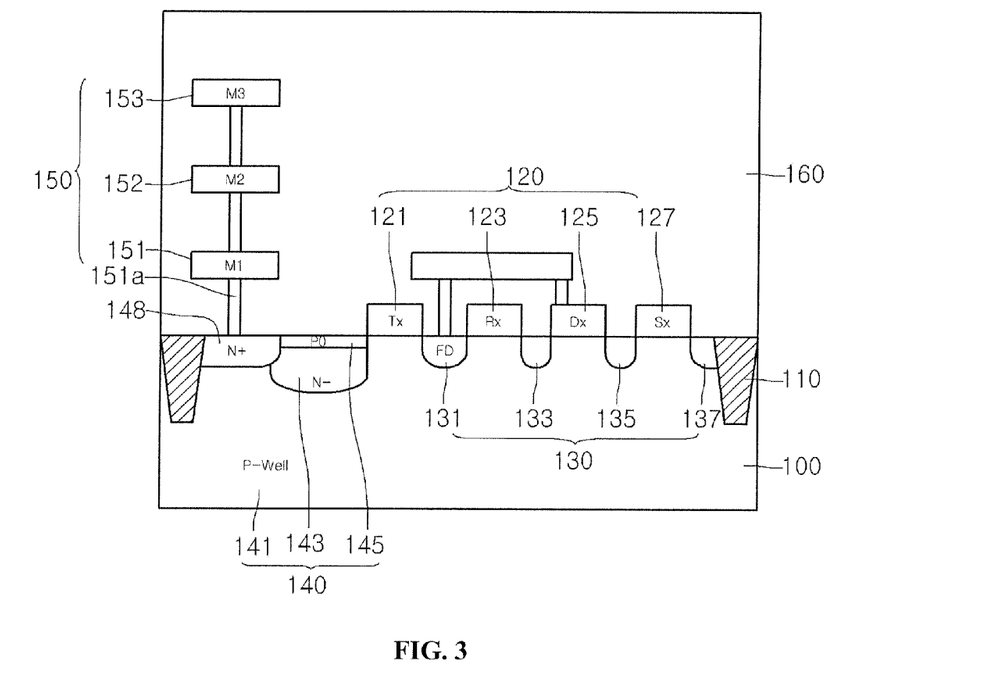

FIG. 3 illustrates another structure of a readout circuit. As shown in FIG. 3, a first conductive type connection 148 may be formed at one side of the electrical junction region 140.

Referring to FIG. 3, an N+ connection 148 may be formed at a P0/N-/P- junction 140 for an ohmic contact. The N+ connection 148 is different than the N+ connection 147, which may generate a leakage source during the formation process of the N+ connection 147 and a first metal contact 151a. The leakage source may occur because an electric field (EF) may be generated over the Si surface due to operation while a reverse bias is applied to P0/N-/P- junction 140. A crystal defect generated during the contact formation process inside the electric field may become a leakage source.

Also, when an N+ connection is formed on the surface of P0/N-/P- junction 140, an electric field may be additionally generated due to N+/P0 junction 148/145. This electric field may also become a leakage source.

Therefore, the embodiment of FIG. 3 proposes a layout in which the first contact plug 151a is formed in an active region not doped with a P0 layer but including the N+ connection 148 that is electrically connected to the N-junction 143.

Then, an electric field is not generated over the surface of the semiconductor substrate 100, which can contribute to reduction of a dark current of a 3D integrated CMOS image sensor.

Referring again to FIG. 1, the interlayer dielectric 160 and the interconnection 150 may be formed on the semiconductor substrate 100. The interconnection 150 may include the second metal contact 151a, a first metal (M1) 151, a second metal (M2) 152, and a third metal (M3) 153, but embodiments are not limited thereto. In an embodiment, after formation of the third metal 153, an insulating layer may be deposited to cover the third metal 153 and may be planarized to complete the interlayer dielectric 160. Thus, the surface of the interlayer dielectric 160 having a uniform surface profile may be exposed on the semiconductor substrate 100.

Figure 4:
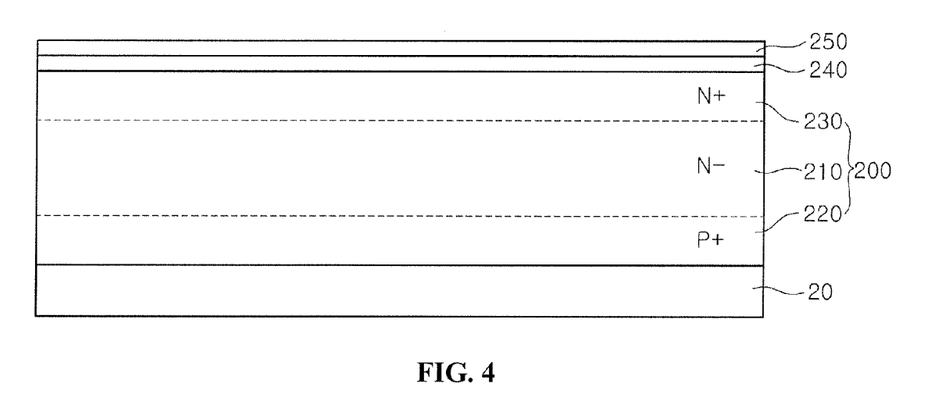

Referring to FIG. 4, an image sensing device 200 is formed on a carrier substrate 20. The carrier substrate 20 may be a mono- or poly-crystalline silicon substrate, and may be a substrate doped with P-type impurities or N-type impurities.

The image sensing device 200 may include a first doped layer 210 and a second doped layer 220 to have a PN junction. Also, an ohmic contact layer (N+) 230 may be formed on the first doped layer 210. Although not shown, hydrogen ions may be implanted into a boundary surface between the carrier substrate 20 and the image sensing device 200 to form a hydrogen layer.

For example, the second doped layer 220 of the image sensing device 200 may be formed by ion-implanting P-type impurities into a deep region of the carrier substrate 20, and the first doped layer 210 may be formed to contact the second doped layer 220 by ion-implanting N-type impurities into the carrier substrate 20. The ohmic contact layer 230 may be formed to contact the first doped layer 210 by ion-implanting high-concentration N-type impurities into a shallow region of the carrier substrate 20.

In an embodiment, the first doped layer 210 may be formed to have a thickness greater than that of the second doped layer 220. In this case, a depletion region is expanded to increase generation of photoelectrons.

Next, a lower electrode layer 240 is formed on the ohmic contact layer 230 of the image sensing device 200. The lower electrode layer 240 may be formed of conductive materials. For example, the lower electrode layer 240 may be formed of one of titanium (Ti), titanium nitride (TiN), tantalum (Ta), cobalt (Co), aluminum (Al), tin (Sn), gold (Au), copper (Cu), lead (Pb), and silver (Ag). Also, the lower electrode layer 240 may be formed through Physical Vapor Deposition (PVD), Chemical Vapor Deposition (CVD), electroplating, and electroless plating methods. Accordingly, the image sensing device 200 and the lower electrode layer 240 may be electrically connected to each other.

A junction layer 250 is formed on the lower electrode layer 240. The junction layer 250 may be formed of an oxide or a nitride.

Figure 5:
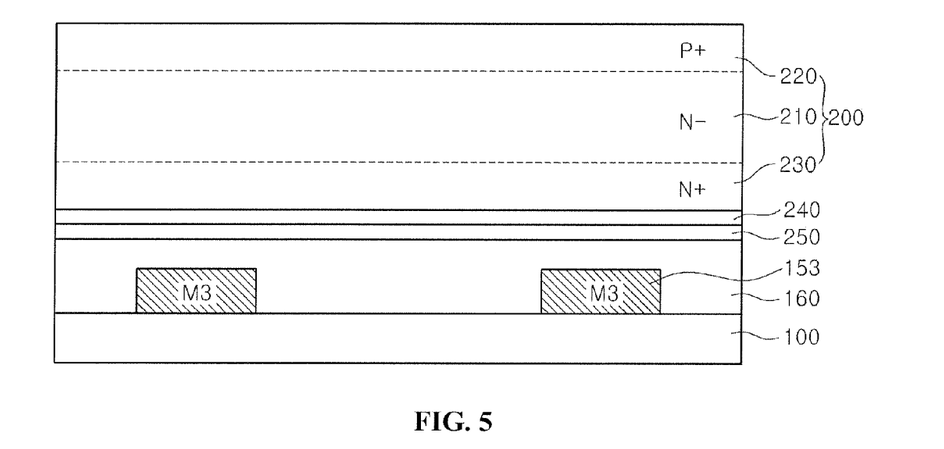

Referring to FIG. 5, the carrier substrate 20 on which the image sensing device 200 is formed is bonded to the interlayer dielectric 160 of the semiconductor substrate 100. For reference, the third metal 153 of the interconnection 150 shown in FIG. 5 represents a portion of the readout interconnection 150 and the interlayer dielectric 160 shown in FIG. 1. For convenience of explanation, portions of the readout circuitry 120 and the interconnection 150 have been omitted in FIGS. 5-12.

The bonding between the semiconductor substrate 100 and the carrier substrate 200 may be performed after the interlayer dielectric 160 faces the junction layer 250. That is, after the carrier substrate 20 is rotated by 180 degrees such that the junction layer 250 faces downward, the bonding between the semiconductor substrate 100 and the interlayer dielectric 160 may be performed.

Particularly, the interlayer dielectric 160 and the junction layer 250 may be formed of the same material to improve the bonding strength between the semiconductor substrate 100 and the carrier substrate 20.

Although not shown, after the image sensing device 200 is bonded to the interlayer dielectric 160, the carrier substrate 20 may be separated from the image sensing device 200 at a hydrogen layer through heat treatment or mechanical impact.

Accordingly, the image sensing device 200 is formed over the readout circuitry 120, thereby enhancing a fill factor and inhibiting defects of the image sensing device 200. Since the image sensing device 200 is bonded by the junction layer 250, physical bonding strength can be increased.

Figure 6:
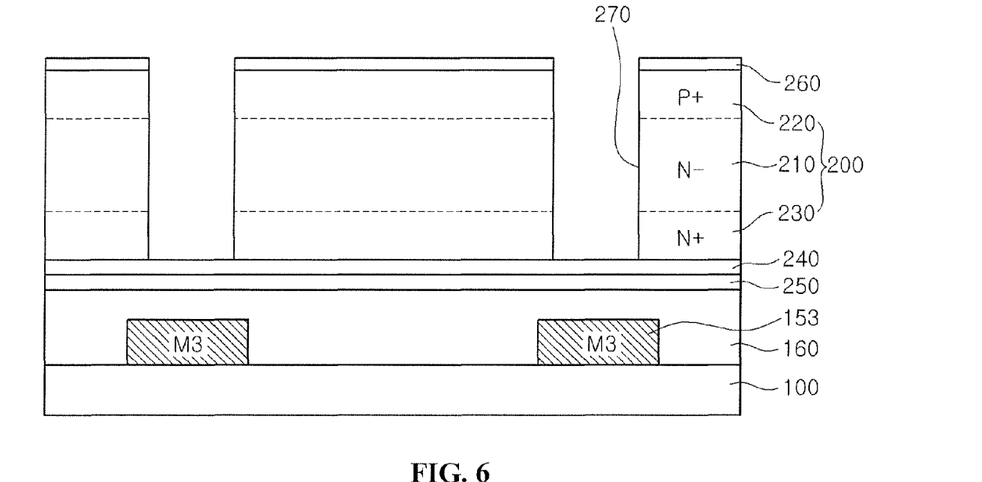

Referring to FIG. 6, a first via hole 270 is formed through the image sensing device 200. The first via hole 270 may expose the lower electrode layer 240 at a region corresponding to the third metal 153.

Specifically, after a first hard mask layer (not shown) is formed on the image sensing device 200, a first hard mask 260 is formed to expose the second doped layer 220 corresponding to the third metal 153. In an embodiment, the first hard mask 260 may be formed of an oxide and a nitride. Then, the image sensing device 200 is selectively etched using the first hard mask 260 as an etch mask. In this case, since the lower electrode layer 240 serves as an etch stop layer, the first via hole may be formed to penetrate only the image sensing device 200.

The first and second doped layers 210 and 220 and the ohmic contact layer 230 of the image sensing device 200 may be exposed at the sidewalls of the first via hole, and the lower electrode layer 240 may be exposed at the bottom surface of the first via hole 270.

Figure 7:
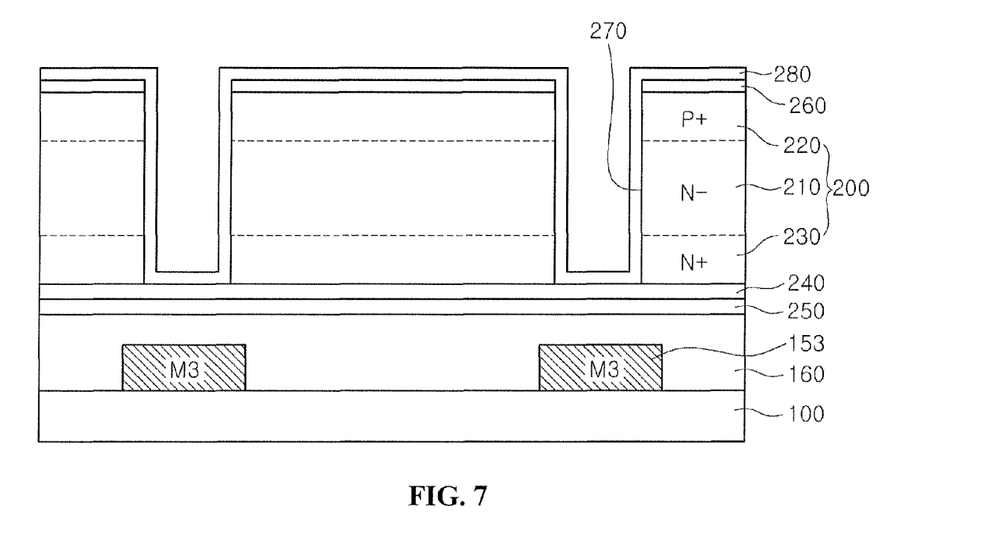

Referring to FIG. 7, a barrier layer 280 is formed on the image sensing device 200 including the first via hole 270. The barrier layer 280 may be formed of the same material as the first hard mask 260.

The barrier layer 280 may be formed on the surface of the first hard mask 260 and the sidewalls and the bottom surface of the first via hole 270.

Accordingly, the first and second doped layers 210 and 220 and the ohmic contact layer 230 exposed at the sidewalls of the first via hole 270 are covered by the barrier layer 280. The lower electrode 240 exposed at the bottom surface of the first via hole 270 is also covered by the barrier layer 280.

Figure 8:
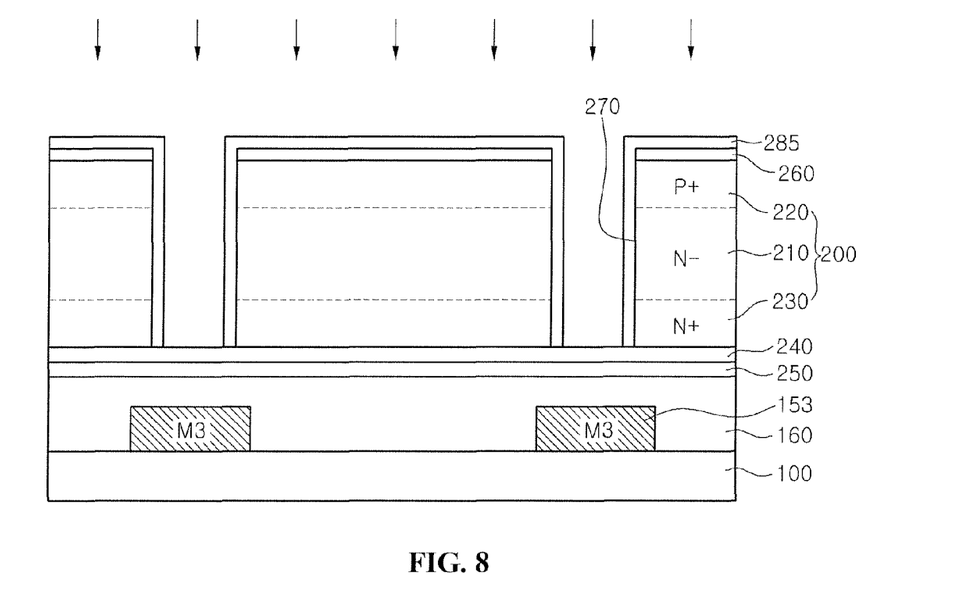

Referring to FIG. 8, a barrier pattern 285 is formed to expose the lower electrode layer 240 at the bottom surface of the first via hole 270.

The barrier pattern 285 may be formed through a blanket etch process on the barrier layer 280.

That is, if the blanket etch process is performed on the barrier layer 280, only the barrier layer 280 formed on the bottom surface of the first via hole 270 is etched to selectively expose the lower electrode layer 240 under the first via hole 270. This is because the thickness of the barrier layer 280 formed on the bottom surface of the first via hole 270 is formed smaller than those of the first hard mask 260 and the first barrier pattern 285 over the image sensing device 200. In the blanket etch process, the barrier layer 280 on the first hard mask 260 may be simultaneously removed, leaving the barrier pattern 285 only on the sidewall of the first via hole 270.

The first and second doped layers 210 and 220 and the ohmic contact layer 230 at the sidewalls of the first via hole 270 are covered by the barrier pattern 285. Only the lower electrode layer 240 at the bottom of the first via hole 270 at the region corresponding to the third metal 153 is exposed.

Figure 9:
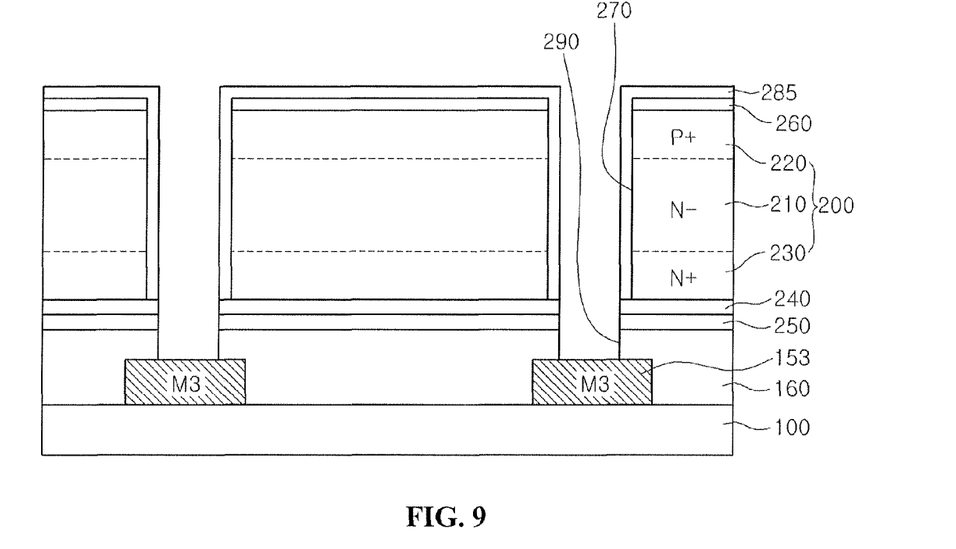

Referring to FIG. 9, a second via hole is formed through the lower electrode layer 240 and the interlayer dielectric 160 under the first via hole 270 to expose the third metal 153 of the interconnection 150.

The interconnection 150 is exposed at the bottom surface of the second via hole 290. Also, the lower electrode layer 240 is exposed at the sidewalls of the second via hole 290.

Figure 10:
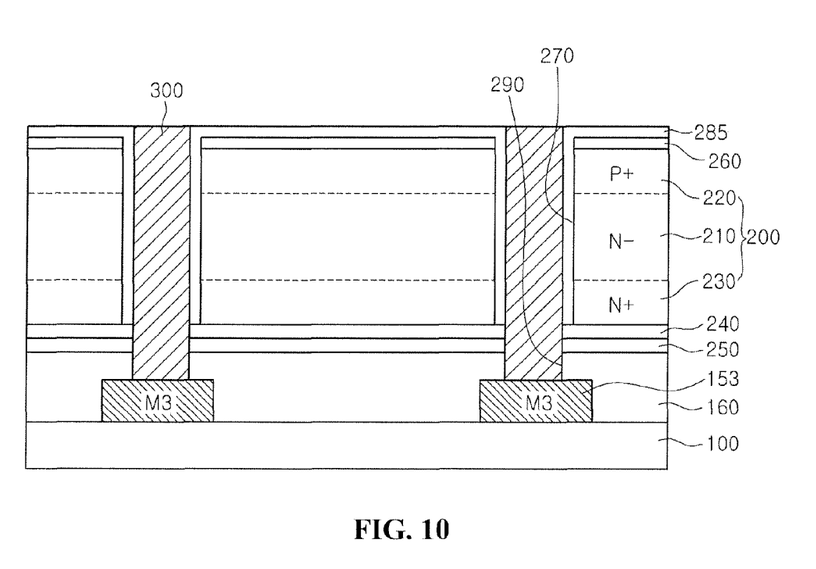

Referring to FIG. 10, a fourth metal contact 300 is formed in the first and second via holes 270 and 290. The fourth metal contact 300 may electrically connect the image sensing device 200 and the readout circuitry 120 through the lower electrode layer 240.

The fourth metal contact 300 may be formed by gap-filling a metal material in the first and second via holes 270 and 290.

For example, the fourth metal contact 300 may be formed of at least one of metal materials such as tungsten (W), Al, Ti, Ta, Ta/Ti, TiN, Ti/TiN, and Cu.

The fourth metal contact 300 may be formed in the first and second via holes 270 and 290 to be electrically connected to the third metal 153 and the lower electrode layer 140. This is because the image sensing device 200 in the first via hole 270 is covered by the barrier pattern 285, and only the lower electrode layer 240 and the third metal 153 are selectively exposed by the second via hole 290.

Accordingly, the fourth metal contact 300 formed in the first and second via holes 270 and 290 may be directly connected to the third metal 153 and the lower electrode layer 240. The lower electrode layer 240 is in an electrical connection state under the ohmic contact layer 230 of the image sensing device.

Accordingly, photocharges generated in the image sensing device 200 may be delivered to the readout circuitry 120 through the lower electrode layer 240 and the interconnection 150. Particularly, since the image sensing device 200 is connected to the lower electrode layer 240 without direct contact with the fourth metal contact 300, the contact resistance can be lowered. Also, since the lower electrode layer 240 is overall positioned under the image sensing device 200, the transmission efficiency of photocharges can be improved.

Figure 11:
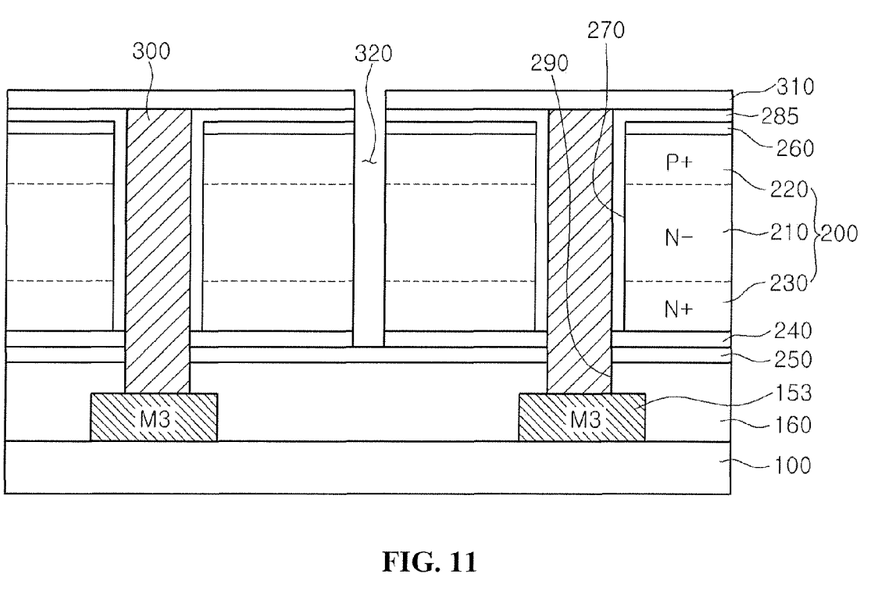

Referring to FIG. 11, a pixel isolation trench 320 is formed in the image sensing device 200 to separate the image sensing device 200 into unit pixels. The pixel isolation trench 320 may be formed to expose the junction layer 250 by selectively etching the image sensing device 200 and the lower electrode layer 240. Alternatively, when the pixel isolation trench 320 is formed, an over-etch process may be performed to expose the surface of the interlayer dielectric 160.

In order to form the pixel isolation trench 320, a second hard mask 310 is formed to selectively expose the surface of the barrier pattern 285 at a region between the fourth metal contacts 300. Then, the barrier pattern 285, the first hard mask 260, the image sensing device 200, and the lower electrode layer 240 are etched using the second hard mask 310 as an etch mask to form the pixel isolation trench 320.

Referring to FIG. 12, a pixel isolation layer 330 is formed in the pixel isolation trench 320. The pixel isolation layer 330 may be formed by gap-filling insulating materials such as an oxide or a nitride in the pixel isolation trench 320.

The image sensing device 200 and the lower electrode layer 240 can be separated into unit pixels by the pixel isolation layer 330.

Although not shown, an upper electrode, a color filter, and a microlens may be formed over the image sensing device 200.

According to an embodiment, an image sensing device is formed on a semiconductor substrate in which a readout circuitry is formed, thereby enhancing a fill factor.

Also, since the image sensing device and the semiconductor substrate are bonded by a junction layer, physical bonding strength can be improved.

In addition, a fourth metal contact is formed in a via hole penetrating the image sensing device, and the metal contact is electrically connected to a lower electrode layer under the image sensing device. Accordingly, since the lower electrode layer serves as an ohmic contact of the image sensing device and an interconnection, signal input/output can be efficiently performed.

Since a barrier pattern is formed on the sidewall of a via hole penetrating the image sensing device, a selective etching process removing a portion of the metal contact in the via hole can be omitted, thereby improving productivity.

Furthermore, since the lower electrode layer is overall formed under the image sensing device, transmission efficiency of photocharges can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
   forming a readout circuitry on a semiconductor substrate;
   forming an interconnection and an interlayer dielectric on the semiconductor substrate, the interconnection being electrically connected to the readout circuitry;
   forming an image sensing device on a carrier substrate;
   forming a lower electrode layer on the image sensing device;
   forming a junction layer on the lower electrode layer;
   bonding the image sensing device to the interlayer dielectric using the junction layer as a bonding layer;
   forming a first via hole through the image sensing device, the first via hole exposing a portion of the lower electrode layer at a region corresponding to the interconnection;
   forming a barrier pattern on a sidewall of the first via hole;
   forming a second via hole through the lower electrode layer and the interlayer dielectric under the first via hole, the second via hole exposing the interconnection; and
   forming a metal contact in the first via hole and the second via hole to electrically connect the lower electrode layer and the interconnection.

2. The method according to claim 1, wherein the forming of the first via hole comprises:
   forming a first hard mask on the image sensing device, the first hard mask selectively exposing the image sensing device at a region corresponding to the interconnection; and
   etching the image sensing device using the first hard mask as an etch mask,
   wherein the lower electrode layer is used as an etch stop layer in the etching of the image sensing device.

3. The method according to claim 1, wherein the forming of the barrier pattern comprises:
   forming a barrier layer along surfaces of the image sensing device and the first via hole; and removing the barrier layer from a bottom surface of the first via hole by performing a blanket etch process on the barrier layer to selectively expose the lower electrode layer.

4. The method according to claim 1, wherein the forming of the second via hole comprises etching the electrode layer and the interlayer dielectric using the barrier pattern on the sidewall of the first via hole as an etch mask.

5. The method according to claim 1, wherein the junction layer is formed of the same material as the interlayer dielectric.

6. The method according to claim 1, wherein the lower electrode layer is formed of a conductive material.

7. The method according to claim 1, further comprising forming a pixel isolation layer penetrating the image sensing device and the interlayer dielectric at a pixel boundary.

8. The method according to claim 1, wherein forming the image sensing device comprises forming an ohmic contact layer, a first doped layer, and a second doped layer on the carrier substrate.

* * * * *